United States Patent [19]

Medal

[11] Patent Number: 5,672,036
[45] Date of Patent: Sep. 30, 1997

[54] WELDABLE PLASTIC FASTENER

[75] Inventor: James Medal, Cape Coral, Fla.

[73] Assignee: Unimation, Inc., Ft. Myers, Fla.

[21] Appl. No.: 568,638

[22] Filed: Dec. 7, 1995

Related U.S. Application Data

[63] Continuation-in-part of Ser. No. 452,356, May 30, 1995, which is a continuation-in-part of Ser. No. 390,184, Feb. 17, 1995, which is a continuation-in-part of Ser. No. 84,699, Jun. 29, 1993, Pat. No. 5,391,031, which is a continuation-in-part of Ser. No. 887,722, May 22, 1992, Pat. No. 5,222, 850.

[51] Int. Cl.$^6$ ............... F16B 37/06; F16B 39/02
[52] U.S. Cl. ............ 411/82; 411/171; 411/339; 411/437; 411/930
[58] Field of Search ............. 411/82, 238, 171, 411/338, 339, 437, 908, 930; 29/426.5; 285/21

[56] References Cited

U.S. PATENT DOCUMENTS

| | | | |
|---|---|---|---|
| 3,353,849 | 11/1967 | Laurizio | 285/21 |
| 3,403,718 | 10/1968 | Hughes | |
| 4,626,308 | 12/1986 | Ansell | 156/257 |
| 4,842,462 | 6/1989 | Tildesley | 411/180 |
| 4,906,313 | 3/1990 | Hill | 156/158 |
| 4,927,183 | 5/1990 | Steinmetz et al. | 285/21 |
| 4,934,859 | 6/1990 | Dixon et al. | 411/437 X |
| 4,938,314 | 7/1990 | Sitzler et al. | 184/1.5 |
| 4,941,788 | 7/1990 | Highfield | 411/178 |
| 5,033,925 | 7/1991 | Moghe | 411/82 X |
| 5,098,242 | 3/1992 | Schaty | 411/437 |
| 5,452,977 | 9/1995 | Terrizzi | 411/258 X |

FOREIGN PATENT DOCUMENTS

| | | |
|---|---|---|
| 2461142 | 1/1981 | France . |
| 32 09 920 A1 | 9/1983 | Germany . |

*Primary Examiner*—Neill R. Wilson
*Attorney, Agent, or Firm*—Fitch, Even, Tabin & Flannery

[57] ABSTRACT

A bolt and nut formed from a plastic material are provided with the bolt having proximate and distal ends and the nut having an interior surface defining a bore. Raised projection members are formed integrally extending from the nut interior surface into the bore and together define a diameter slightly smaller than the shank diameter. In this manner, an interference fit is provided between the shank and projection members. With the bolt shank inserted through aligned holes in parts to be fastened, the nut can be mounted on the distal end of the bolt shank, as by a force fit, and slid thereon by exerting an axial force on the nut until the parts are clamped between the bolt head and nut. At the interface formed by the engaged projection members and the bolt shank at the areas engaged with a force fit, intermixing of the respective plastic materials of the shank and projections can occur which, when solidified, forms a bond at the interface to secure the nut in place on the shank and thereby provide a good and secure clamping force to the fastened parts. To separate the parts, a torque force sufficient to break the bond formed between the projections and shank is applied to the nut. The nut can then be removed from the shank and the shank withdrawn from the aligned part holes, thus allowing the parts to be separated in their original state without any damage thereto.

17 Claims, 3 Drawing Sheets

WELDABLE PLASTIC FASTENER

This application is a continuation-in-part of application Ser. No. 452,356, filed May 30, 1995, which in turn is a continuation-in-part of application Ser. No. 390,184, filed Feb. 17, 1995, which is a continuation-in-part of application Ser. No. 084,699, filed Jun. 29, 1993, now U.S. Pat. No. 5,391,031, which is a continuation-in-part of application Ser. No. 887,722, filed May 22, 1992, now U.S. Pat. No. 5,222,850.

FIELD OF THE INVENTION

This invention relates to fasteners and to a method for securely maintaining a clamping force on bodies fastened together by fasteners and, more particularly, to a weldable plastic fastener assembly and a method for clamping fastened bodies together with provision made for ease of disassembly, without damage to the bodies.

BACKGROUND OF THE INVENTION

Bolts are typically formed of a metal material with a head at one end and a screw thread on the other. An internally threaded nut formed of a metal material can be mounted on the threaded bolt end. The bolt and nut combination can be used to fasten objects together with the bolt being passed through clearance holes in two or more parts and the nut engaged on the threaded end to draw the parts together.

Such a bolted assembly forms a temporary connection in that the nut can be removed from the bolt shank to release the parts. Accordingly, this threaded-type fastener is used to form a connection that can be disassembled and reconnected and that must resist tension and shear forces that may be applied to the fastened parts. The nut is tightened on the bolt such that the bolt head and nut exert a clamping force on the parts fastened thereby. The nut must be tightened on the bolt with sufficient torque to produce a pre-load tension in the bolt so that during vibration, the relative stress change is slight with consequent improved fatigue resistance and locking of the nut. The clamping force produced by the pre-loading also increases the friction between the inner bearing surfaces of the members so that shear loads are carried by the friction forces rather than by the bolt. To enhance the pre-load, oftentimes lock washers are used on the bolt shank between the nut and the fastened members.

Thus, a temporary bolted connection primarily derives its fastening ability from the amount of torque placed on the nut to clamp the members between the nut and bolt head. To increase such torque, special torque wrenches and power tools have been developed to apply high levels of torque to the nut as it is screwed on the bolt shank in engagement with an adjacent fastened member. To engage and turn the nut or, bolt head with the other clamped in place against removable sockets rotation, wrenches typically have adjustable jaws or use removable sockets and power tools can use socket sleeves which mate with the nut. None of these are particularly satisfactory for assembly operations, especially when the parts being assembled utilize small nuts and bolts for space savings, such as in electronic equipment, where the size requires highly precise positioning and operation of the torquing tool while simultaneously avoiding contact with surrounding components. To apply torque to the nut, the bolt head must be clamped against rotation, again requiring enough room and time for a clamping or holding tool to be employed. In addition, where power tools are incorporated in automated assembly operations, the space required for mechanical power transmission systems for applying torque can be significant.

One important application of the inventive fasteners herein is with printed circuit boards as the use of metallic nuts and bolts in electronic equipment employing printed circuit boards can cause problems as described below. Where the nut and bolt are formed from metal material and are used to secure printed circuit boards in equipment housings, such as to mounting brackets or the like, or where the nut and bolt are used to secure several printed circuit boards in spaced relation to each other in a stack, the board typically has mounting holes drilled in peripheral positions on the board away from the circuit pattern and elements thereon so as not to interfere with the conductor paths of the circuit. This can be a significant limitation on the use of metal fasteners in electronic devices, particularly where space savings are important, as it reduces flexibility in design of the mounting arrangements for printed circuit boards. The torque required to produce the necessary clamping force and pre-load tension on the bolt to lock the nut thereon can cause the bolt head and nut to damage the protective coatings used on the parts to be fastened. Where the coated parts are metallic, damaged coatings can provide sites for corrosion to begin. With printed circuit boards, their coatings can provide both mechanical support to the connections thereon and environmental protection to the circuitry components and, accordingly, any damage thereto is undesirable.

To improve the durability and strength of fastened connections, assemblies are provided utilizing permanent fasteners, such as rivets and welds, to transfer loads. To permanently assemble parts using rivets, a rivet having a pre-formed head on one end is inserted through aligned holes in two or more parts to be joined and then by impacting and pressing the protruding end, a second head is formed to hold the parts together permanently. Parts can also be permanently fastened by welding where interengaging portions of the parts and/or a filler are heated until they coalesce, with the heat then removed to allow the liquid to solidify to join or weld the parts together. For smaller parts, soldering guns or irons can be used to connect components as on circuit boards. The heat source for welding larger metal parts is typically a welding gun or torch which produces an electric arc or a direct flame.

Once such a permanent connection is achieved as by riveting or welding, it is extremely difficult and time consuming for the connection to be broken for disassembly of the parts. With welding, portions of the parts themselves typically will be integrally bonded with each other and/or filler material as with soldering. Subsequent separation at the welded joint can damage or destroy those portions of the parts that were welded compromising their integrity to the point that they are no longer useful for their desired purpose. Temporary connections produced by conventional screw fasteners are also undesirable in that the threaded nut and bolt assembly can loosen over time, particularly under prolonged exposure to vibration and shear forces resulting in a loose connection between attached components. With computers and printed circuit boards being incorporated into automobiles, aircraft and other industrial equipment, exposure to vibration and shock stresses are not unusual and loosening of the attachments can cause serious problems in the electronic equipment utilized and lead to malfunction of any operating systems they may control.

Thus, there is a need for a new fastening method and a fastener which can provide a secure and strong clamping force to attach parts, while also allowing the parts to be readily disassembled from each other. The nut and bolt fastener should be easily and quickly applied to attach parts without having to apply and rely on torque forces to achieve a secure connection. In the application of the fastener, the clamping force exerted by the nut and bolt head preferably should not cause damage to the parts. The fastener should provide a connection similar to that provided by fasteners which permanently attach parts while at the same time allowing the fastener to be removed from the parts so that they can be disassembled in their original state without any damage thereby allowing for their reuse and reassembly, if desired.

SUMMARY OF THE INVENTION

In accordance with the present invention, a method and/or a plastic nut and bolt combination are provided for fastening parts such as panels and the like with a strong and secure clamping force. The plastic nut and bolt fastener described herein provide a strong and secure connection similar to that afforded by permanent fasteners while allowing the parts to be quickly disassembled from each other without damage to the parts. As the inventive nut and bolt are formed of a plastic material, the clamping force exerted thereby will normally not damage engaged part bodies, particularly those part bodies formed of materials that are less ductile or harder than the plastic material from which the nut and bolt are fabricated. In addition, since the nut and bolt are plastic, they will not interfere with electrical paths and connections used in electronic equipment, such as the conductor paths formed on printed circuit boards.

More particularly, a bolt and nut formed from a plastic material are provided with the bolt having proximate and distal ends and the nut having an interior surface defining a bore. Raised projection members are formed integrally extending from the nut interior surface into the bore and together define a diameter slightly smaller than the shank diameter. In this manner, an interference fit is provided between the shank and projection members. With the bolt shank inserted through aligned holes in parts to be fastened, the nut can be mounted on the distal end of the bolt shank, as by a force fit, and slid thereon by exerting an axial force on the nut until the parts are clamped between the bolt head and nut. At the interface formed by the engaged projection members and the bolt shank at the areas engaged with a force fit, than by the use of heat as from an ultrasonic source or by use of a liquid bonding agent, the engaged plastic materials of the shank and projections are liquified and then are solidified to form a bond at the interface to secure the nut in place on the shank and thereby provide a good and secure clamping force to the fastened parts. To separate the parts, a torque force sufficient to break the bond formed between the projections and shank is applied to the nut. The nut can then be removed from the shank and the shank withdrawn from the aligned part holes, thus allowing the parts to be separated in their original state without any damage thereto.

In one form, the bolt shank has its distal end chamfered and the projection members extend axially and have at least one inclined surface. The inclined surfaces of the projections engage and cam against the chamfered bolt distal end as the nut is mounted on the bolt shank. The camming engagement of the projection members with the distal ends of the bolt shank more readily allows the nuts to be mounted on the shank with the interference fit between the projections and the shank surface. One manner in effecting the bond between the projections and bolt shank is to apply a bonding agent such as an acetone, a liquid cyanoacrylate ester, or the like to the projection members. The bonding agent such as cyanoacrylate ester works with application of pressure, such as applied from the press fit of the nut onto the bolt shank.

Thus, when the nut is mounted on the shank, the interface between the projection members and bolt shank is under compressive pressure forces which will cause the bonding agent to liquify the plastic at the interface with the plastic flowing together and intermixing so as to provide an integral bond at the interface between the shank and nut.

In another form of the invention, an assembly for maintaining a clamping fastening force on panels is provided. The assembly includes an upper and a lower panel each having top and bottom surfaces and a bore extending through each of the panels from the top to the bottom surface. A plastic bolt is provided having a head and a shank having a first predetermined diameter with the shank extending from the bolt head. A plastic nut is provided having a first end and a second end with a central bore wall extending through the nut from the first end to the second end to define a shank receiving bore having a second predetermined diameter. A plurality of axial plastic projection members are on the bore wall with the projection members defining a third predetermined diameter less than the shank first diameter to provide an interference fit with the shank when the nut is mounted on the shank. The nut and shank are bonded upon reducing the regions between the projections and shank to a flowable state which then solidify to thereby bond the nut on the shank. The bolt shank can be inserted in aligned bores of the panels and the nut mounted on the end of the bolt shank distal from the bolt head until it engages the lower panel bottom surface to exert a clamping force on the panels by the bolt head on the upper panel top surface and the nut on the lower panel bottom surface. The interface between the shank and projections is then reduced to a flowable state to intermix and then solidify to securely maintain the clamping force exerted by the bolt head and nut on the panels.

Preferably, the projections are in the shape of a trapezoid having inclined surfaces spaced inwardly in the nut bore from the nut ends to allow the nut to be mounted on the bolt shank by engagement of either inclined surface with the shank distal end and with either one of the first and second nut ends engaging the lower panel bottom surface.

The projections are circumferentially spaced around the nut bore wall to define spaces therebetween to allow plastic to flow and also to allow the nut to be removed from the shank by breaking the bonds formed at the interface between the projections and the shank surface upon application of a loosening torque force to either the head or the nut. To facilitate the removal of the nut from the bolt shank, the spaces between the projections preferably occupy a greater volume in the nut bore than the volume occupied by the projections.

Another manner in which the interface between the projections and shank can be reduced to their flowing, liquid state is by use of ultrasound to heat the respective plastics. Tools are commercially available utilizing an ultrasound actuator to apply ultrasound energy to plastic interfaces. By the employment of relatively small projections in the nut bore, the dwell time can be reduced to a minimum, typically well under a second. Such time savings achieved with the inventive fastener herein can lead to substantial increases production efficiency over conventional threaded-type fasteners requiring a torque application force, particularly in continuing assembly operations.

DETAILED DESCRIPTION OF THE PREFERRED EMBODIMENT

Figure 1:
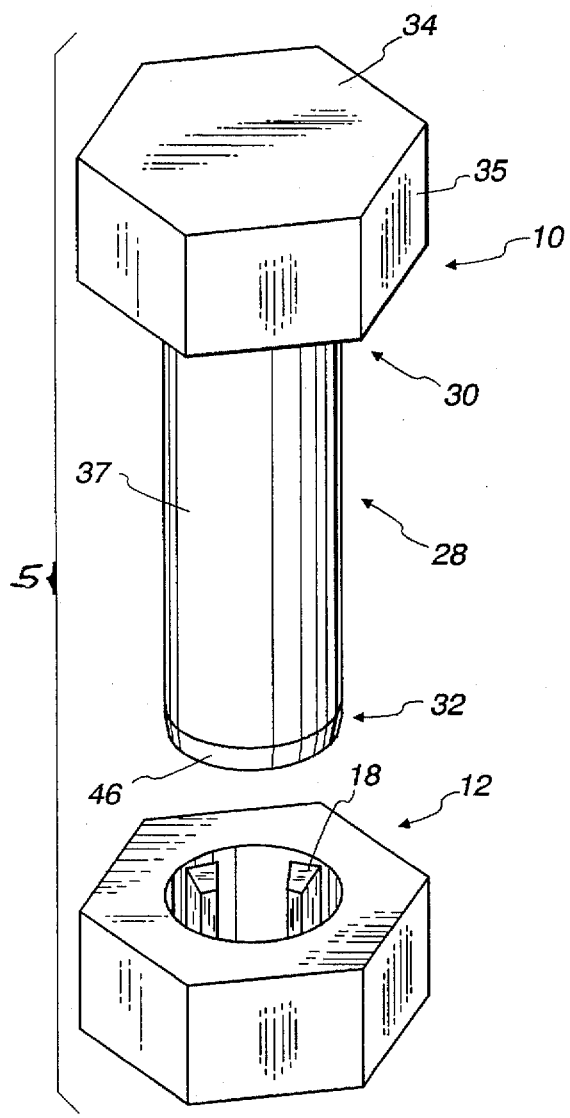
FIG. 1 is a perspective view of a weldable fastener showing a plastic nut and bolt combination according to the present invention.

In FIG. 1, a weldable fastener 5 including a plastic bolt 10 and nut 12 according to the present invention are illustrated. The nut and bolt of the present invention are formed from a plastic material such as a polycarbonate, polypropylene or nylon material, and can be used for fastening bodies together, such as the panels 14 and 16 illustrated in FIGS. 5–8. The nut 12 is mounted on the bolt 10 by way of raised projection members 18 formed on the nut 12 so that the nut 12 can be secured on the bolt 10 as by an integral bond between the bolt and projections and thereby provide a good, secure clamping force on the bodies 14 and 16.

Figure 2:
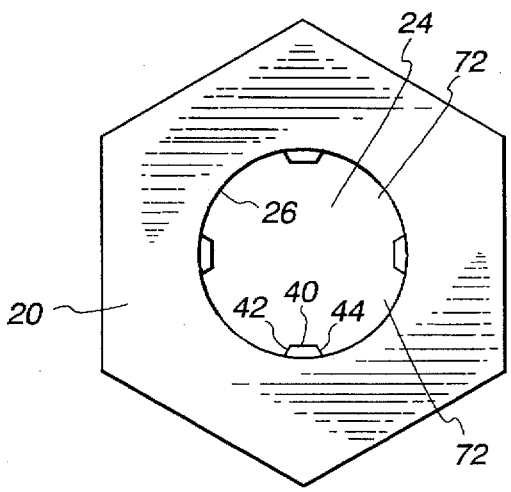
FIG. 2 is a top plan view of the nut of FIG. 1 showing the raised projection members on the nut bore wall.
Figure 3:
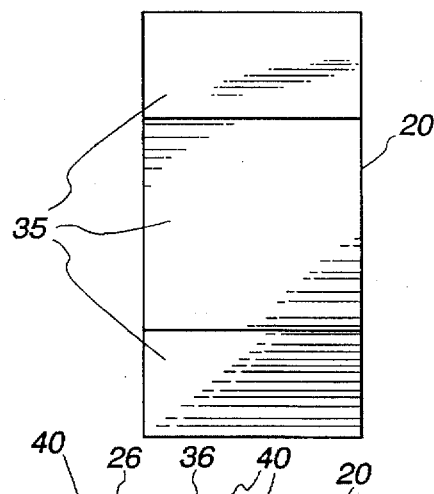
FIG. 3 is an elevational view of the nut showing the flats thereof.
Figure 4:
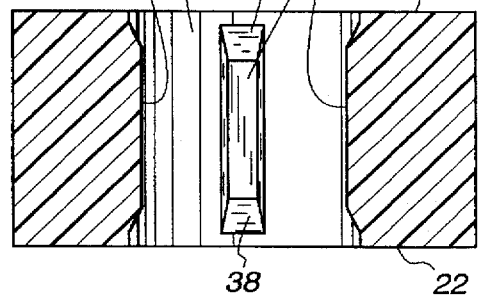
FIG. 4 is a sectional view of the nut through the bore and showing the integral projection members.

More particularly and referring to FIGS. 2–4, the nut 12 has opposite end surfaces 20 and 22 with a bore 24 extending through the nut 12 between the end surfaces 20 and 22. Preferably, the nut 12 has a polygonal shape and is illustrated as a hex nut having flats 25 with the bore 24 being centrally located and defined by a cylindrical bore wall 26 extending between the end surfaces 20 and 22. The raised projection members 18 are spaced circumferentially around the bore wall 26 and are adapted to engage the elongate shank 28 of the bolt 10 as the nut 12 is press fit and slid thereon.

The bolt elongate shank 28 has a proximate end 30 and a distal end 32 with the enlarged bolt head 34 formed at the proximate end 30, as is conventional. Preferably, the bolt head 34, similar to the nut 12, has a polygonal shape having flats 35, and is illustrated having a hexagonal shape, and the bolt shank 28 has a cylindrical surface 37 adapted to receive the nut 12 thereon. The annular bore wall 26 has a predetermined diameter which can be sized substantially the same or slightly larger than the diameter of the shank cylindrical surface 37. By way of example, in one preferred embodiment, the nut bore wall 26 has a diameter 0.130 inch. The projection members 18 extend radially a predetermined distance into the annular bore 24 and together define a diameter slightly smaller than the diameter of the bolt shank 28 so as to provide an interference fit between the projection members 18 and bolt shank surface 37. Where the bore wall predetermined diameter is 0.130 inch, the projections 18 can extend radially 0.0072 inch from the bore wall 26, and define a diameter 0.1158 inch.

In the preferred and illustrated form, the projection members 18 extend axially along the bore wall 26 between and spaced from the nut end surfaces 20 and 22. The projections 18 are shown to be in the shape of a trapezoid having opposite inclined surfaces 36 and 38 which extend from the bore wall 26 towards the interior of the bore 24 with the inclined surface 36 positioned in the bore 24, spaced inwardly from the end surface 20 and the inclined surface 38 positioned in the bore 24 spaced inwardly from the end surface 22, as best seen in FIG. 3. The inclined surfaces 36 and 38 extend towards each other and are joined by a top, axially extending surface 40. In the preferred embodiment, the inclined surfaces are inclined at a 15° angle from the bore wall 26. The projections 18 also include slightly inclined side surfaces 42 and 44 extending from the bore wall 26 at an angle to the top surface 40 between the inclined end surfaces 36 and 38.

Although the exact number of projections 18 can vary, in the preferred and illustrated embodiment, four projection members 18 are spaced equally at 90° intervals on the annular bore wall 26. Thus, the predetermined diameter defined by the projection members 18 can be measured across the bore 24 from the top surface of opposite projection members 18. As the top surfaces 40 define a diameter therebetween smaller than the diameter of the shank cylindrical surface 37, the inclined surfaces 36 and 38 are provided to assist in mounting the nut 12 on the shank 28 so that as the distal end 32 of the shank 28 is inserted into the bore 24, the distal end 32 will engage and cam along one of the inclined surfaces 36 and 38 to progressively increase the interference and the compressive forces exerted between the shank 28 and projection members 18. To further facilitate mounting of the nut 12 onto the bolt 10, the shank distal end 32 can be chamfered, as illustrated in FIG. 1, forming an annular ramp surface 46 which can cam against one of the inclined surfaces 36 and 38 to facilitate press-fitting of the nut 12 onto the bolt shank 28.

With the nut 12 mounted on the bolt 10 to exert a clamping force for fastening parts as described above, the interference fit provided between the projection members 18 and shank surface 37 will cause their interengaging portions to be under compressive pressure forces. The interengaging portions between the projection members 18 and shank surface 37 can then be brought to their flowable state at their interface, such as by a bonding agent. Suitable bonding agents include those using acetone or cyanoacrylate ester that causes the plastics to form a liquid or semi-liquid state initially when the plastic is placed in compression and then to cure or otherwise harden to integrally bond the nut 12 on the bolt 10. Alternatively, ultrasound tools can be utilized to apply ultrasound heat energy to the areas interengaged by the force-fit between the projection members 18 and shank surface 37. Utilizing the inventive plastic weldable bolt 10 and nut 12 herein can save substantial time in applying the fasteners 5 to parts versus conventional threaded-type fasteners and other means for forming permanent connections, e.g., riveting and conventional welding or soldering, as the dwell times for the application of ultrasound to the interengaged areas can be controlled by sizing of the projection members 18 so that it is well under one second.

Figure 5:
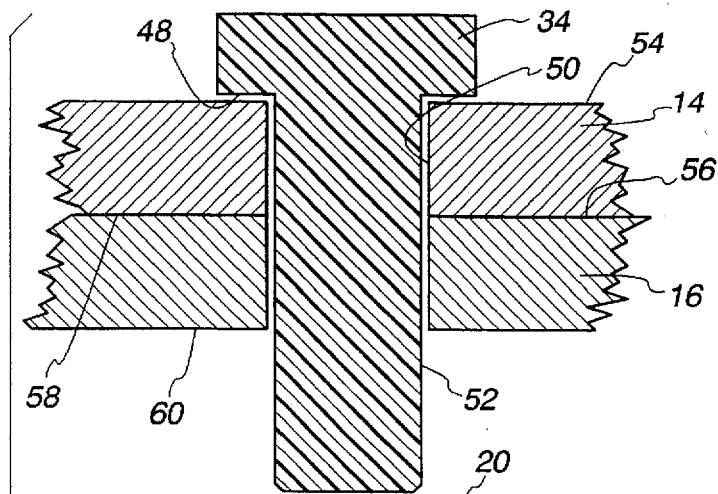
FIG. 5 is a sectional view of the bolt and nut with the bolt extending through aligned bores in a pair of panels to be joined together.
Figure 6:
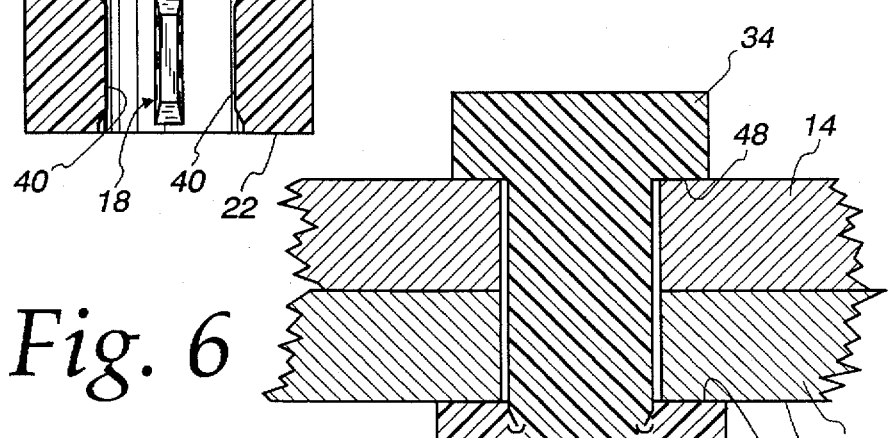
FIG. 6 is a side sectional view similar to FIG. 5 showing the nut mounted on the distal end of the bolt shank showing the integral bond formed between the projection members and the shank with the panels securely clamped between the nut and the bolt head.
Figure 7:
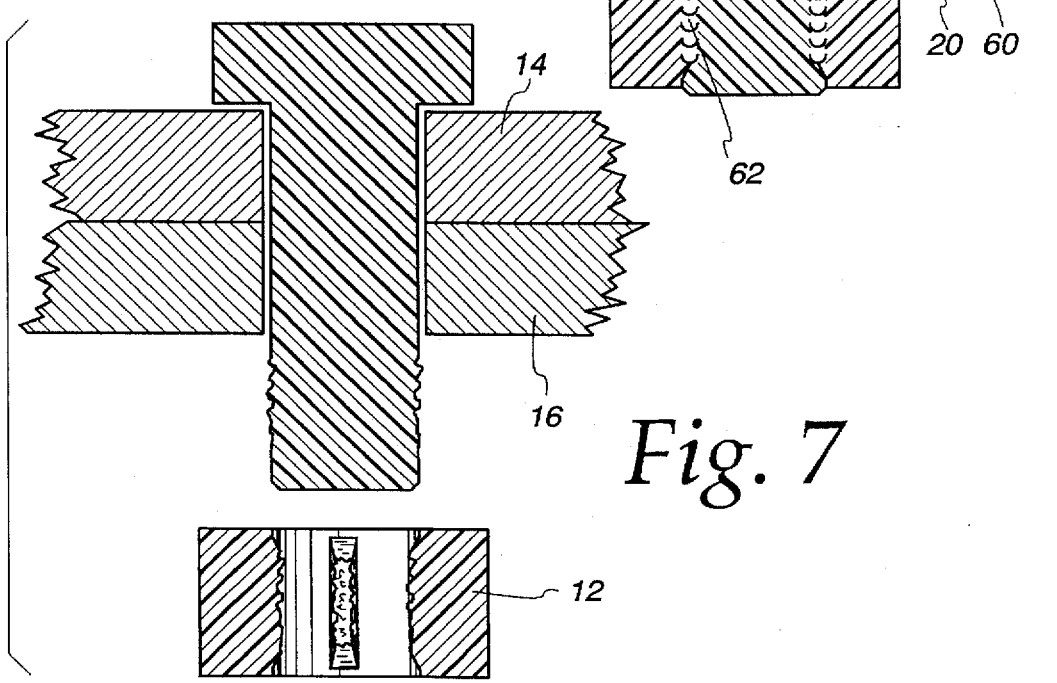
FIG. 7 is a side sectional view similar to FIGS. 5 and 6 showing the nut removed from the shank to allow the parts to be separated by breaking of the bond formed at the interface between the projections and the shank.
Figure 8:
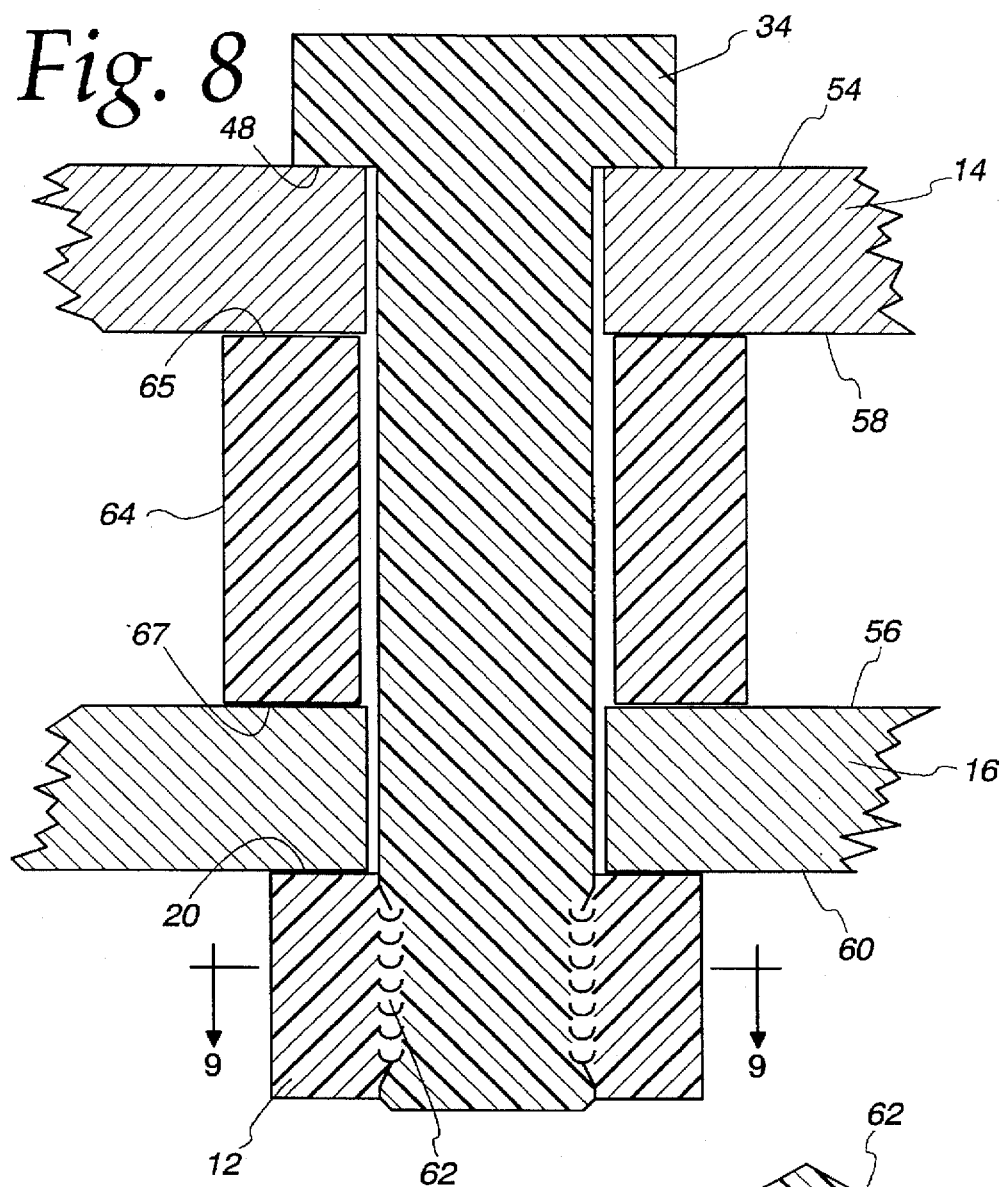
FIG. 8 is a side sectional view showing a modified belt shank inserted through aligned holes in the panels with a spacer member mounted on the shank to space the panels from each other.

Thus, to fasten a pair of bodies together, such as panels 14 and 16 illustrated in FIGS. 5–7, or the panels 14 and 16 in spaced relation to each other by way of intermediate member 64 therebetween, such as illustrated in FIG. 8, the bolt shank 10 is inserted through the aligned holes of the bodies with the nut 12 then being press fit on the distal end 32 of the bolt 10. More specifically and referring to FIGS. 5–7 the panels 14 and 16, which can be metal, plastic, or any other material, are fastened together by the clamping force between one of end surfaces 20 and 22 of the nut 12 and the bottom 48 of the bolt head 34.

The panels 14 and 16 have mounting throughbores 50 and 52, respectively, drilled or pre-formed therein. The panels 14 and 16 each include respective top surfaces 54 and 56, and bottom surfaces 58 and 60. To fasten the panels 14 and 16 together, the bottom surface 58 of the panel 14 and the top surface 56 of the panel 16 are abutted flush against each other such that the respective bores 50 and 52 of the panels 14 and 16 are aligned with each other. The bolt shank 28 can then be inserted through the aligned holes 50 and 52 with the nut 12 then being press fit on the shank 28, as described earlier. The nut 12 can be slid along the portion of the shank 28 protruding from the bottom surface 60 of the lower panel 16. Since the nut 12 has projection members 18 with inclined surfaces 36 and 38 at both ends, the nut 12 can be slid onto the protruding shank portion with either of its opposite end surfaces 20 and 22 facing the bottom surface 60 of the lower panel 16 so that the chamfered end of the shank 28 will engage one of the inclined surfaces 36 and 38 depending on which respective end surface 20 and 22 is facing the bottom surface 60.

As illustrated in FIGS. 5–6, the nut 12 is slid axially onto the protruding bolt shank portion with the surface 20 facing the bottom surface 60 until these two surfaces are engaged with continued axial force bringing the bottom 48 of the bolt head 34 into secure clamping engagement with the top surface 54 of the upper panel 14. In this manner, a clamping force is exerted on the panels 14 and 16 by the bolt head 34 and the nut 12.

With the nut 12 in clamping arrangement on the bolt shank 28 and the panels 14 and 16 clamped therebetween, the areas engaged with a force fit between the engaged projection members 18 and the shank 28 are brought to their flowable state at their interface and form a region 62 of blended plastic thereat, as described earlier and shown in FIG. 6. Once the plastics are intermixed and blended in the region 62, the plastic region 62 can be cooled and cured to solidify and integrally bond the nut 12 in its clamping arrangement on the bolt shank 28. With the integral bonding of the nut 12 to the shank 28, the fastener of the present invention is a significant improvement over conventional threaded-type fasteners which can tend to loosen over time under the influence of tension and shear forces, particularly when utilized in high shock or vibration environments. The bonding at the plastic region 62 provides a good, strong resistance to tension forces tending to pull the nut 12 off of the shank 28 similar to that provided by other permanent fasteners such as rivets. Unlike conventional welding or soldering, the integrity of the interface between the fastened parts is not compromised so that upon removal of the nut 12 from the bolt 10, as described below, the parts can be released from their fastened connection in their original state for reuse and reassembly.

To remove the nut 12 integrally secured on the bolt shank 28, as shown in FIG. 6, a turning torque force can be applied to the nut 12 by engaging the flats 25 with jaws of pliers, wrenches or the like as done with conventional threaded-type fasteners while holding the bolt head against rotation. Alternatively, the torque force could be applied to the bolt head 34 while holding the nut 12 against rotation; however, turning of the nut 12 is preferred since it provides a mechanical advantage as the bond to be broken by the torque force is in the nut bore 24.

A turning torque force sufficient to break the bonds formed in the region 62 should be applied to the nut thus allowing the release of the parts 14 and 16 without damage thereto as only the broken bonds at the areas 62 on the projection members 18 and bolt shank 28 will be damaged by the turning torque force, as seen in FIG. 7. This is of particular importance where the parts should have the capability of being disassembled and then reused as by reassembly to another part such as with another one of the inexpensive plastic nut and bolt fasteners 5 taught herein.

Referring to FIG. 8, the panels 14 and 16 can be printed circuit boards and the intermediate member 64 can be a tubular spacer to allow the printed circuit boards to be mounted in spaced relation to each other on the bolt shank 28. In this manner, the printed circuit board panels 14 and 16 are stacked on the shank 28 in engagement with the opposite end shoulders 65 and 67 of the spacer 64 and clamped thereagainst by the bottom 48 of the bolt head 34 and the nut end surface 20. Such stacking of printed circuit boards is of particular value in electronic equipment where space savings are important and, accordingly, more spacers 64 and a longer bolt shank 28 can be utilized depending on the number of boards to be stacked. Thus, when the boards need to be replaced, interchanged or maintained such as by adding and removing electronic components thereto, the nut 12 bonded on the shank 28 can be removed by applying a turning torque force sufficient to break the bonds in regions 62 between the projection members 18 and the shank 28.

Figure 9:
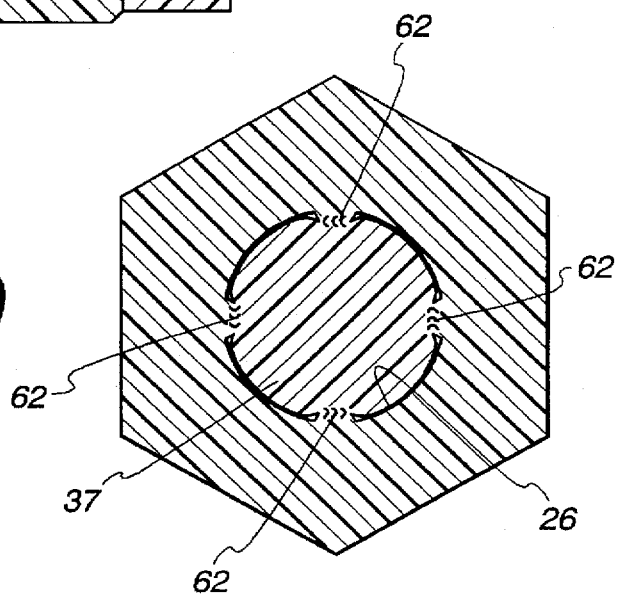
FIG. 9 is a cross-sectional view taken along line 9—9 of FIG. 8 showing the nut mounted on the distal end of the modified bolt shank.

Manifestly, it will be apparent that the dwell time required to bond the projection members 18 to the shank 28 can be varied by varying the size and number of the projections 18 formed on the bore wall 26. In addition, the amount of torque necessary to break the bonds between the projection members 18 and the shank 28 can also be adjusted based on the number and size of projection members 18 provided. In the preferred and illustrated form, four projection members 18 are spaced equally at 90° intervals on the nut annular bore wall 26 so that with the nut 12 mounted on the bolt shank 28, the spaces 72 formed between the projection members 18 will occupy a greater volume in the bore 24 than the projection members 18. With four projection members 18, a good and secure connection can still be achieved between the projection members 18 and the shank 28 while still allowing for a turning torque force to break the integral bonds formed between the projections 18 and shank surface 37. As the projections 18 are relatively small compared to the spaces 72 between adjacent projection members producing regions 62 of intermixed plastic which are relatively small in comparison to the distance around the circumference the bore 24 and shank 28, as seen in FIG. 9, the turning torque force required to break the bonds formed between the projections 18 and shank surface 37 can be controlled and limited such that the required breaking torque force, for example, may be only slightly greater than that required to unscrew a conventional nut which is tightly screwed and locked on a threaded bolt shank. Application of the bond breaking torque allows the nut 12 to be removed from the shank 28 to effect release of the parts.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention. So, for instance, while the nut and bolt fastener illustrated herein is non-threaded, it is possible for threaded bolts and/or nuts to be utilized while still falling within the purview of the present invention.

What is claimed is:

1. A plastic nut and bolt combination for fastening panels to each other, the combination comprising:

a bolt having a shank formed from a plastic material and having proximate and distal ends thereof;

a polygonal nut formed from a plastic material and having exterior flats and an interior surface defining a bore;

a plurality of raised projection members formed integrally extending from the nut interior surface into the bore together defining a diameter slightly smaller than the shank diameter so as to provide an interference fit between the shank and projection members; and a bonded interface being located between the engaged projection members and the bolt shank at the areas engaged with a force fit comprising a solidified intermixture of the respective plastic materials which forms a bond with each other at the bonded interface, application of a torque force allowing removal of the nut from the shank by breaking the bond formed therebetween at the interface.

2. The combination of claim 1 wherein the bolt has an enlarged head formed at the proximate end of the shank and the panels have aligned bores through which the shank is inserted with the nut clamping against the bottom panel to tightly capture the panels between the nut and the bolt head.

3. The combination of claim 1 wherein the bolt shank has its distal end chamfered and the projection members extend axially and have at least one inclined surface to allow the inclined surfaces of the projections to engage and cam against the chamfered bolt distal end as the nut is mounted on the bolt shank.

4. The combination of claim 3 wherein the projection members have oppositely facing inclined surfaces at either end thereof to allow the nut to be mounted on the shank by engagement of either of the oppositely facing inclined surfaces of the projections with the bolt distal end.

5. The combination of claim 1 wherein there are four equally spaced projection members on the nut interior annular surface.

6. The combination of claim 1 wherein the projection members extend axially along the nut interior surface and substantially have the shape of a trapezoid having inclined surfaces facing the bore openings.

7. The combination of claim 6 wherein the inclined surfaces are spaced inwardly within the nut bore from the bore openings.

8. An assembly for maintaining a clamping fastening force on panels, the assembly comprising:

an upper and a lower panel each having top and bottom surfaces and a bore extending through each of the panels from the top to the bottom surface;

a plastic bolt having a head and a shank having a first predetermined diameter with the shank extending from the bolt head;

a plastic nut having a first end and a second end with a central bore wall extending through the nut from the first end to the second end to define a shank receiving bore having a second predetermined diameter;

a plurality of axial plastic projection members on the bore wall with the projection members defining a third predetermined diameter less than the shank first diameter to provide an interference fit with the shank when the nut is mounted on the shank with the nut and shank being bonded upon reducing the regions between the projections and shank to a flowable state which then solidifies to thereby bond the nut on the shank;

the bolt shank being inserted in aligned bores of the panels and the nut is mounted on the end of the bolt shank distal from the bolt head until it engages the lower panel bottom surface to exert a clamping force on the panels by the bolt head on the upper panel top surface and the nut on the lower panel bottom surface; and a bonded plastic interface between the shank and projections having been defined by their respective plastics having been liquified to a flowable state to intermix and then solidified to maintain the clamping force exerted by the bolt head and nut on the panels.

9. The assembly of claim 8 wherein the axial projections are in the shape of a trapezoid having inclined surfaces spaced inwardly in the nut bore from the nut ends to allow the nut to be mounted on the bolt shank by engagement of either inclined surface with the shank distal end and with either one of the first and second nut ends engaging the lower panel bottom surface.

10. The assembly of claim 8 wherein the projections are circumferentially spaced around the nut bore wall to define spaces therebetween to allow the nut to be removed from the shank by breaking the bonds formed at the interface between the projections and the shank surface upon application of a loosening torque force to either the head or the nut.

11. The assembly of claim 10 wherein the spaces between the projections occupy a greater volume in the nut bore than the volume occupied by the projections.

12. The assembly of claim 8 wherein there are four projections spaced equally at 90 degree intervals on the nut annular wall.

13. The assembly of claim 8 wherein the projections are formed integrally with the nut bore wall and the bolt and nut are formed from the same plastic material comprising one of a polycarbonate, a polypropylene and a nylon plastic material.

14. The assembly of claim 8 further comprising a spacing member on the bolt shank between the upper and lower panel with the clamping force pushing the upper panel bottom surface and the lower panel top surface into engagement with opposite ends of the spacing member.

15. A plastic nut for welding to a plastic bolt having a shank with a predetermined diameter, said plastic nut comprising:

a body of plastic;

exterior flats on the body defining a peripheral surface for the body and to be engaged by a tool to turn the nut;

an interior surface in the plastic body defining a bore with an axis in the body to receive therein the bolt shank;

a plurality of axially-extending projections in the bore projecting radially inwardly toward the axis; and the interior axially-extending surfaces on the projections being spaced from one another about the interior surface of the bore and defining a diameter smaller than the bolt shank to have an interference fit with the bolt shank and for being liquified and for intermixing with plastic of the bolt and thereby forming a plastic bond with the bolt shank, the axially-extending projections being substantially trapezoidal in cross-section with said interior, axially-extending surfaces being smaller in size than base portions of the projections integrally joined to the interior bore surface.

16. A method of securing two members together with a plastic bolt having a shank and a head with a plastic nut, said method comprising the steps of:

abutting the two members together having bolt receiving openings in the respective members being aligned to receive a bolt;

inserting the bolt shank through the openings and abutting the bolt head against one of the members;

providing a nut with a bore having inwardly-extending projections in the bore defining a diameter less than a diameter of the bolt shank;

forcibly sliding the axial projections on the nut relative to the bolt shank to provide a force fit at an interface between the projections and the bolt shank when the nut is slid onto the bolt shank;

liquefying the plastic of the bolt and nut at the interface to intermix the bolt and nut plastics; and solidifying the intermixed plastic at the interface to bond the nut to the bolt shank and thereby securing the two members together.

17. A method in accordance with claim 16 including the step of disassembling the nut from the bolt by applying a turning torque to the nut to break the bond at the interface to allow removal of the nut from the bolt shank.

* * * * *